Dec. 5, 1961 M. J. MANAHAN 3,012,194

TUNING INDICATOR MEANS FOR SATURABLE CORE TUNER

Filed Aug. 14, 1959

INVENTOR.
Max J. Manahan
BY
Robert E. Fowler
ATTORNEY 3,012,194

TUNING INDICATOR MEANS FOR SATURABLE CORE TUNER

Max J. Manahan, Kokomo, Ind., assignor to General Motors Corporation, Detroit, Mich., a corporation of Delaware Filed Aug. 14, 1959, Ser. No. 833,775
3 Claims. (Cl. 324—78)

This invention relates to tuning indicating means for radio receiving apparatus and more particularly to tuning indicating means for advising the operator of the frequency of a signal being received in radio receiving equipment where the tuning is accomplished by changing the saturation of the core means upon which the tuning coils are mounted.

Radio apparatus conventionally includes resonant circuits formed of both inductive and capacitivity reactance, the value of either one being changeable to tune these circuits over a given designed frequency band for tuning the equipment. In the early days it was common practice to tune a receiver by using one or more variable condensers which usually were provided with a rotatable shaft for changing the capacity of the same and driving indicating means from said shaft to indicate the frequency of the carrier signal waves being received. Later permeability tuning became popular, particularly in automobile radio receivers because of the saving in space. In this type of tuning the tuneable resonant circuits were varied by changing the inductance of tuning coils by inserting or withdrawing small cores therefrom. A more recent innovation is to change the inductance of tuning coils without any movable parts by urging current through excitation or saturating windings on the core means for the tuning coils which in turn varies the saturation of the core and thus the inductance. Such a tuned radio receiving circuit is shown and described in application Serial No. 710,725, filed January 23, 1958 in the name of Max J. Manahan entitled Pulsed Magnet Saturation Signal Seeking Tuner, assigned to a common assignee. However, since the variable quantity used to tune the receiver is a variation in the flux flowing in a magnetic circuit in order to provide indicating means for the tuning means some means must be provided which is sensitive to said flux variation.

It is, therefore, an object in making this invention to provide indicating means for saturable core radio tuning means.

It is a further object in making this invention to provide tuning indicating means for saturable core tuning means which may be easily located adjacent the radio receiving means or at a remote location.

With these and other objects in view which will become apparent as the specification proceeds, my invention will be best understood by reference to the following specification and claims and the illustrations in the accompanying drawing, in which:

Figures 1, 2, 3, 4:
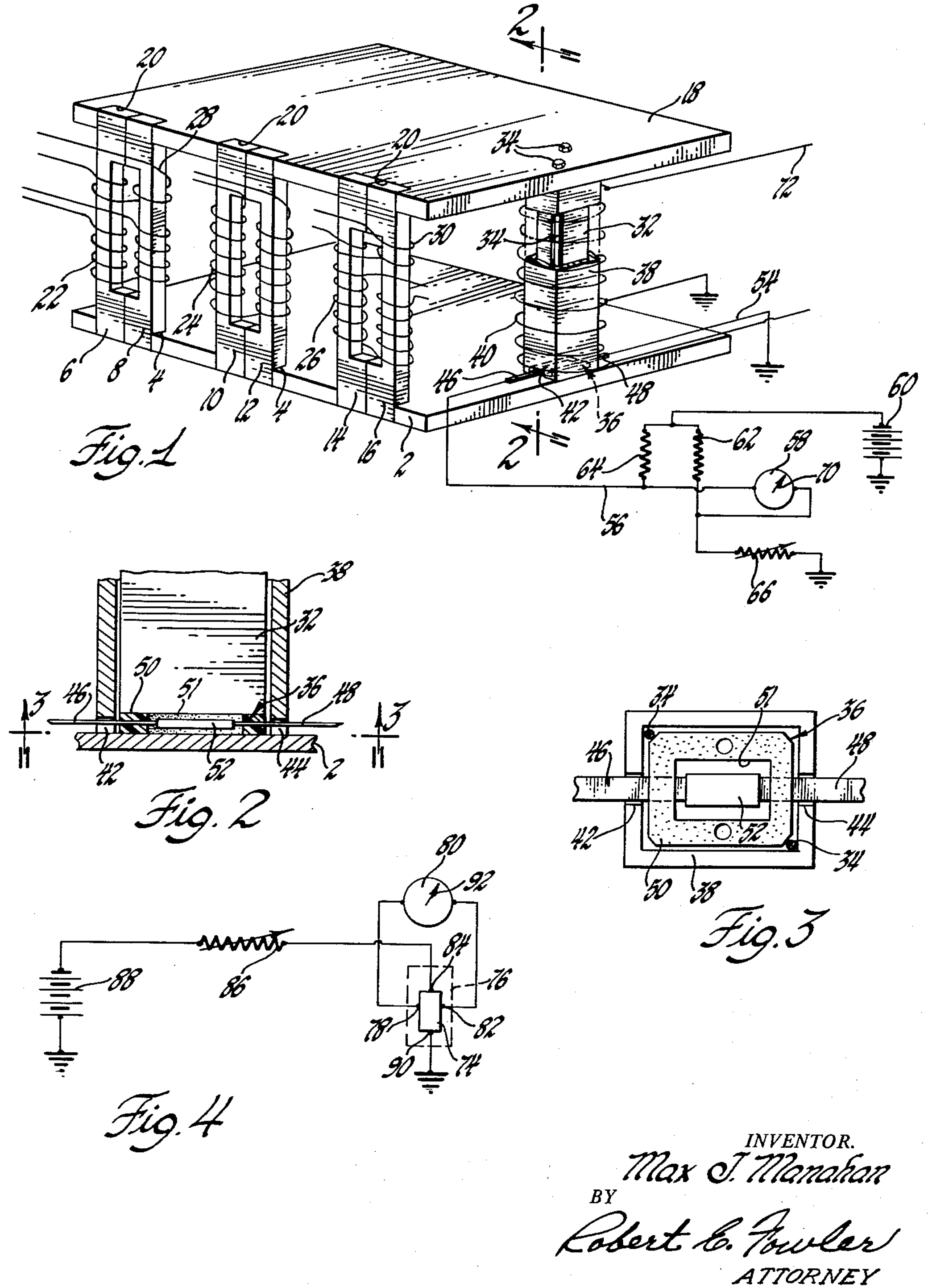
FIGURE 1 is a perspective view of a saturable core tuner together with associated circuitry embodying my invention.
FIGURE 2 is a partial sectional view taken on line 2—2 of FIGURE 1.
FIGURE 3 is a sectional view taken on line 3—3 of FIGURE 2.
FIGURE 4 is a circuit diagram of a modified form embodying my invention.

Referring now more particularly to FIGURE 1, there is shown therein a saturable core tuner frame which consists of a plurality of magnetizable core members having roughly a box-shaped configuration. A flat panel 2 forms a supporting base and contains a series of notches 4 in one edge in which are mounted one end of several pairs of transverse core members 6–8, 10–12 and 14–16. Spaced at a short distance from and parallel to the base 2 is a second flat member 18 which also has matching notches 20 in an edge thereof parallel to the corresponding edge of base 2 in which the opposite or upper ends of the paired core members 6–8, 10–12 and 14–16 are supported. These three sets of core members support the tuning inductance coils of a radio receiver, such for example as the antenna, RF and oscillator tuning coils. For example, core members 6–8 may have wound thereon the primary winding antenna tuning coil. They also support the secondary winding 28 which may be connected directly to the input of the first amplifier. Core members 10–12 may support the oscillator tuning coil 24 and lastly, the core members 14–16 may support a primary RF tuning coil 26 and also the RF secondary coil which is connected directly to the input of the amplifier.

Mounted between the two end plates 18 and 2 there is the return magnetic path which consists of a pole piece 32 extending substantially the full distance between the plates. However, in order to obtain a satisfactory indication of the flux passing through the complete magnetic circuit and a sufficiently large change as the tuner is varied which can be calibrated in frequency, a pick-up unit is inserted between one end of the pole piece 32 and one of the plates, in this illustration the plate 2, although it may be inserted at either end. A plurality of longitudinally extending bolts 34 pass through the two end plates and lie adjacent the sides of the core member 32 to hold the assembly together. By tightening up on the bolts and/or nuts that may be used on the opposite ends the pick-up unit shown generally at 36 is clamped between the end of the pole piece 32 and the plate 2. A hollow coil form 38 is slid over the outside of the core 32 and also the supporting bolts 34 and extends the full distance between the plates and carries thereon a magnetizing winding 40 whose purpose is to excite the core and changes in current flow through this winding will tune the receiver as will be later explained. The coil form is provided with notches 42, 44 in opposite sides of the lower end through which leads 46 and 48 extend which are connected to the sensitive element and in circuit with the indicating apparatus. By placing the pick-up member in this position it is affected by substantially the total flux passing through the magnetizing circuit for the core.

The pick-up unit consists of a frame 50 of non-magnetic material which in the present instance is roughly rectangular having a hollow central cut out portion. In this portion there is supported a sensitive member whose resistance changes with the variation in the flux density passing therethrough. For example, a crystal of indium antimonide may be used. As shown in FIG. 2 such a crystal is supported on two leads which pass through the frame 50 and since the crystal is thinner than the frame it is protected by the same. When the pick-up unit is placed under the end of the core 32 and the core presses against the sides of the frame the sensitive crystal 52 is mechanically protected and does not engage either the surface of the base plate 2 or the end of the core rod 32 but is supported in the central aperture 51 by the leads 46 and 48. The leads 46 and 48 may be formed of such material as copper foil and are insulated from the frame to form a circuit element with the crystal.

Certain crystal material such, for example, as indium antimonide, when subjected to a certain flux density in a magnetic circuit has a certain resistance to the flow of electrical current therethrough. A variation in flux density applied to the crystal will vary its resistivity. If the crystal is then connected in a circuit such variations in resistance can be used to indicate changes in flux and in the present instance, may be utilized to indicate frequency changes in the tuneable circuits. The crystal pick-up unit has one lead 48 connected to ground through conductor 54 and the other lead 46 connected through conductor 56 to one side of a bridge circuit and an indicating meter 58. A power source, illustratively shown as a battery 60 which may be the battery of a vehicle, has one terminal grounded and the opposite terminal commonly connected to one terminal each of two resistors 62 and 64 forming bridge arms. The remaining terminal of the resistance 64 is connected to conductor 56 and the other terminal of resistance 62 is connected to ground through variable resistance 66. This forms a bridge circuit consisting of resistance 64 and the pick-up crystal 52 in series on one side and resistances 62 and 66 in series on the opposite side between the power source and ground. The indicating meter 58 is connected directly across the bridge. The pick-up crystal unit thus forms one leg of the bridge. The bridge may originally be balanced by adjusting the resistance 66 at a certain density of flux when the resonance circuits have tuned the receiver to one end of the frequency band for which it is designed. Then as the flux in the saturating circuit changes the resistance of crystal 52 will change causing the bridge to become unbalanced and the indicator 58 to move across its scale. By knowing the frequencies at which the tuner is tuned the scale of the indicator 58 may be calibrated to read the various transmitting and received frequencies as the needle 70 moves.

In order to change the saturation for tuning the potential applied to supply line 72 is gradually changed to change the current flow through the magnetizing winding 40 and change the saturation of the magnetic circuit including the various core means 6–8, 10–12, and 14–16 upon which the tuneable coils are mounted. All of the return flux must, of course, pass through common core 32 so that the pick-up unit is placed at a point of maximum flux concentration. By this means the operator merely observes an electrical meter which indicates the frequency to which the receiving set may currently be tuned.

There are, of course, other ways in which momentary values of flux or changes in flux in a magnetic circuit may be observed and indicated. One of these is by the use of sensitive units utilizing the Hall effect and such units are currently procurable on the market which are sensitive to magnetic flux changes. FIGURE 4 shows a circuit utilizing one of these units. In this case the amount of magnetic flux deflects the flow of current between two terminals rather than changing the resistivity of a part. In FIGURE 4 one of these Hall effect devices, diagrammatically shown at 74, could be located at the same location in the tuneable magnetic circuit as that formerly occupied by the pick-up unit 36 and this is shown in dash outline 76. These devices have four terminals, two transverse terminals of which are connectible directly to an indicating meter. In the present instance, terminal 78 is shown connected to one side of an indicating meter 80 and terminal 82 connected to the other side. The longitudinal terminals apply power and one end terminal 84 of the sensitive unit 74 is connected through a variable resistance 86 to one terminal of a battery or power source 88, the opposite end of which is grounded. Lastly, the remaining terminal 90 of the unit 74 is grounded.

With the unit in place as described and with a magnetic tuner tuned to the low frequency end of the band, resistor 86 is adjusted until the indicating needle 92 of the meter 80 is located at one end of its scale. Then as the control voltage applied to line 72 of magnet winding 40 changes to tune the set and vary the flux, variations in flux concentration deflect the flow of current between terminals 84 and 90 to varying degrees to cause different readings across terminals 78 and 82 and the indicating needle 90 travels over its scale. Again this can be calibrated in the frequency of the carrier waves received so that the indicator 80 will read directly in frequency. In this manner a simple and effective indicating means is provided which can be placed either adjacent the tuning means or at some remote point, whichever is desired from a standpoint of space and utility.

What is claimed is:

1. In saturated core tuning means having a magnetic core system with a transverse gap, an indium antimonide crystal mounted in said gap and subject to the magnetic field therein, a plurality of resistance elements at least one of which is variable connected with said crystal to form a bridge circuit, a source of electrical power connected to said bridge to energize the same and an indicating meter connected across the bridge to indicate any change in the resistance of said crystal caused by changes in the strength of the magnetic field in the core system, said meter being calibrated in frequency of the tuning means.

2. In saturated core tuning means for a radio receiver in which the inductances of the resonant circuits are varied by changing the saturation of the core means upon which they are mounted, said core means having a gap across which a magnetic field is established, a sensitive pick-up unit of the Hall effect type mounted in said gap and having a pair of longitudinal and a pair of transverse terminals, said unit being traversed by the field in the gap, an adjustable source of electrical power connected to the longitudinal terminals of the pick-up unit to apply power thereto and an indicating meter calibrated in frequency connected to the transverse terminals to indicate the frequency of the resonant circuits.

3. In saturated core tuning means for a radio receiver in which the inductances of the resonant circuits are varied by changing the saturation of the core means upon which said inductances are mounted, said core means having a gap therein across which a magnetic field is established, a sensitive pick up unit mounted in said gap and subject to the magnetic field thereacross, said sensitive pick up unit having electrical conductive characteristics which vary dependent upon the strength of the ambient magnetic field present, a source of electrical power, an indicating meter calibrated in the frequencies to which the resonant circuits may be tuned, said sensitive pick up unit, said source of electrical power and said indicating meter being connected together in circuit so that the indicating meter will indicate variations in electrical conduction through the sensitive pick up unit caused by variations in magnetic field strength in the gap and thus indicate the frequency to which the circuits are tuned.

References Cited in the file of this patent

UNITED STATES PATENTS

| | | |
|---|---|---|
| 2,530,178 | Rothkamp | Nov. 14, 1950 |
| 2,649,569 | Pearson | Aug. 18, 1953 |
| 2,906,945 | Weiss | Sept. 29, 1959 |